(12) United States Patent
Choi

(10) Patent No.: US 11,289,600 B2
(45) Date of Patent: Mar. 29, 2022

(54) FIELD EFFECT TRANSISTOR

(71) Applicant: Electronics and Telecommunications Research Institute, Daejeon (KR)

(72) Inventor: Byounggun Choi, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 16/874,033

(22) Filed: May 14, 2020

(65) Prior Publication Data

US 2020/0365732 A1  Nov. 19, 2020

(30) Foreign Application Priority Data

May 17, 2019 (KR) ............ 10-2019-0058000

(51) Int. Cl.
*H01L 29/778* (2006.01)
*H01L 29/78* (2006.01)
*H01L 29/20* (2006.01)

(52) U.S. Cl.
CPC ...... *H01L 29/7838* (2013.01); *H01L 29/2003* (2013.01); *H01L 29/778* (2013.01)

(58) Field of Classification Search
CPC ............ H01L 21/2605; H01L 29/2003; H01L 29/66431; H01L 29/66462; H01L 29/778–7789; H01J 21/105; G04F 5/16; G21H 1/00–12; G21H 3/00; G21H 3/02; G21H 5/00; G21H 5/02; G21H 7/00
See application file for complete search history.

(56) References Cited

U.S. PATENT DOCUMENTS

| | | | |
|---|---|---|---|
| 2,952,817 A * | 9/1960 | Kennedy | H03B 29/00 331/68 |
| 4,275,405 A | 6/1981 | Shannon | |
| 5,314,833 A | 5/1994 | Lee et al. | |
| 5,389,796 A | 2/1995 | Kang et al. | |
| 5,578,512 A | 11/1996 | Tao | |
| 5,949,095 A | 9/1999 | Nagahara et al. | |
| 7,791,130 B2 * | 9/2010 | Baik | H01L 27/11568 257/324 |
| 8,080,805 B2 * | 12/2011 | Gordon | H01L 31/119 250/370.09 |
| 8,114,717 B2 * | 2/2012 | Palacios | H01L 29/7787 438/142 |
| 8,124,505 B1 * | 2/2012 | Burnham | H01L 29/66462 438/483 |
| 2007/0295993 A1 * | 12/2007 | Chen | H01L 29/7786 257/194 |
| 2012/0025087 A1 * | 2/2012 | Daghighian | H01L 29/66462 250/370.01 |

(Continued)

*Primary Examiner* — Eric A. Ward
(74) *Attorney, Agent, or Firm* — Kile Park Reed & Houtteman PLLC

(57) ABSTRACT

Provided is a field effect transistor including a semiconductor layer, a gate electrode provided on a channel region in the semiconductor layer, and a channel adjusting member provided adjacent to the channel region on one surface of the semiconductor layer and overlapping the gate electrode on a plane. Here, the channel adjusting member provides a depletion layer in the channel region.

16 Claims, 6 Drawing Sheets

(56) References Cited

U.S. PATENT DOCUMENTS

| | | | |
|---|---|---|---|
| 2014/0008659 A1* | 1/2014 | Wong | H01L 29/1066 257/76 |
| 2014/0319963 A1* | 10/2014 | Choi | G21H 1/06 310/303 |
| 2014/0346615 A1* | 11/2014 | Zhang | H01L 29/78 257/411 |
| 2015/0214352 A1* | 7/2015 | Strassburg | H01L 29/7787 257/77 |
| 2016/0225864 A1* | 8/2016 | Strassburg | H01L 29/42332 |
| 2018/0308925 A1* | 10/2018 | Chen | H01L 29/1045 |

* cited by examiner

FIELD EFFECT TRANSISTOR

CROSS-REFERENCE TO RELATED APPLICATIONS

This U.S. non-provisional patent application claims priority under 35 U.S.C. § 119 of Korean Patent Application No. 10-2019-0085000, filed on May 17, 2019, the entire contents of which are hereby incorporated by reference.

BACKGROUND

The present disclosure herein relates to a field effect transistor.

A metal-semiconductor field effect transistor (MESFET) is distinguished into a depletion (d)-mode using a negative gate voltage and an enhancement (e)-mode using a positive gate voltage. The d-mode MESFET and the e-mode MESFET have a structural difference in that n-type semiconductor layers functioning as a channel layer have different thicknesses from each other. In general, the semiconductor layer of the d-mode MESFET has a thickness greater than that of the semiconductor layer of the e-mode MESFET. The d-mode MESFET including the semiconductor layer having a greater thickness may drive a current greater than that of the e-mode MESFET and thus be appropriate to a high output. However, since the d-mode MESFET requires a negative power when driven, a power circuit thereof may have a complicated configuration. In contrast, although the e-mode MESFET drives a current less than that of the d-mode MESFET, the e-mode MESFET may not require a negative power, and thus a power circuit thereof may have a simple configuration.

SUMMARY

The present disclosure provides a field effect transistor having an improved electrical property.

The object of the present invention is not limited to the aforesaid, but other objects not described herein will be clearly understood by those skilled in the art from descriptions below.

An embodiment of the inventive concept provides a field effect transistor including: a semiconductor layer; a gate electrode provided on a channel region in the semiconductor layer; and a channel adjusting member provided adjacent to the channel region on one surface of the semiconductor layer and overlapping the gate electrode on a plane. Here, the channel adjusting member provides a depletion layer in the channel region.

In an embodiment, when a voltage is applied to the gate electrode, as a portion of the depletion layer is removed, a channel may be provided in the channel region.

In an embodiment, the depletion layer may be provided by a β-ray emitted from the channel adjusting member.

In an embodiment, the channel adjusting member may be buried in the gate electrode and surrounded by the gate electrode.

In an embodiment, the field effect transistor may further include an adjusting member insulation layer disposed between the channel adjusting member and the gate electrode to electrically insulate the channel adjusting member and the gate electrode from each other.

In an embodiment, the channel adjusting member may overlap the channel region in a substrate provided on a bottom surface of the semiconductor layer.

In an embodiment, the channel adjusting member and the gate electrode may be sequentially laminated on the channel region.

In an embodiment, the channel adjusting member may include a nickel isotope (Ni-63), tritium (H-3), a promethium isotope (Pm-147), or a strontium isotope (Sr-90).

In an embodiment, the field effect transistor may further include a source electrode and a drain electrode, which are provided on the semiconductor layer and spaced apart from each other with the gate electrode therebetween.

In an embodiment, the semiconductor layer may include a gallium nitride (GaN) layer and a gallium aluminum nitride (AlGaN) layer, which are sequentially laminated.

In an embodiment of the inventive concept, a field effect transistor includes: a semiconductor layer; a source electrode and a drain electrode, which are spaced apart from each other on a top surface of the semiconductor layer; a gate electrode disposed between the source electrode and the drain electrode on the top surface of the semiconductor layer; and a channel adjusting member buried in the gate electrode. Here, the channel adjusting member emits β-particles to the semiconductor layer.

In an embodiment, the field effect transistor may further include a depletion layer provided in a channel region of the semiconductor layer by the β-particles.

In an embodiment, a portion of the depletion layer may be removed by a positive voltage applied to the gate electrode, and a channel may be provided in the channel region of the semiconductor layer.

In an embodiment, the field effect transistor may further include an adjusting member insulation layer disposed between the channel adjusting member and the gate electrode to electrically insulate the channel adjusting member and the gate electrode from each other.

In an embodiment, the channel adjusting member may include a nickel isotope (Ni-63), tritium (H-3), a promethium isotope (Pm-147), or a strontium isotope (Sr-90).

In an embodiment, the semiconductor layer may include a gallium nitride (GaN) layer and a gallium aluminum nitride (AlGaN) layer, which are sequentially laminated.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
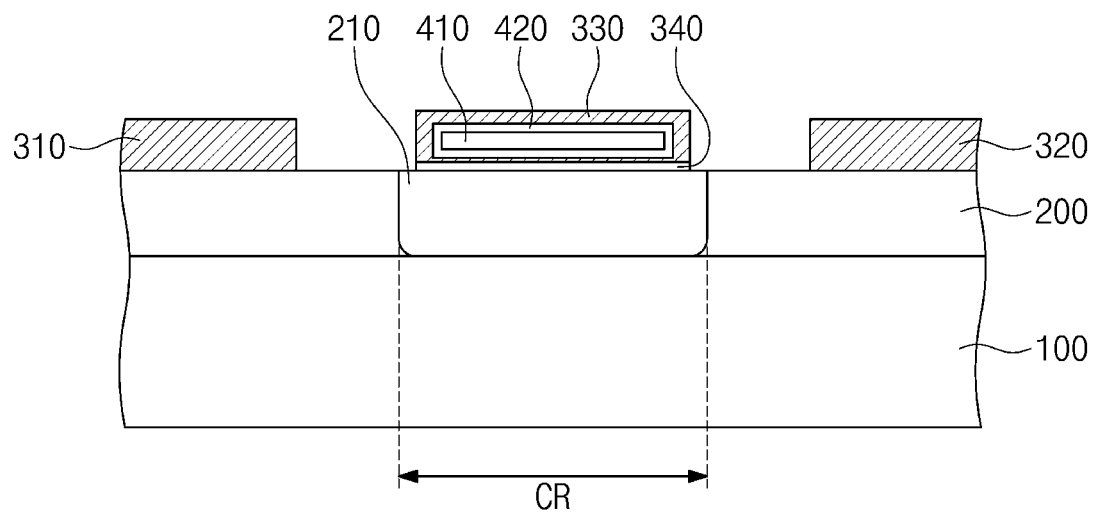
FIGS. 1 and 2 are cross-sectional views for explaining the field effect transistor according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Figure 2:
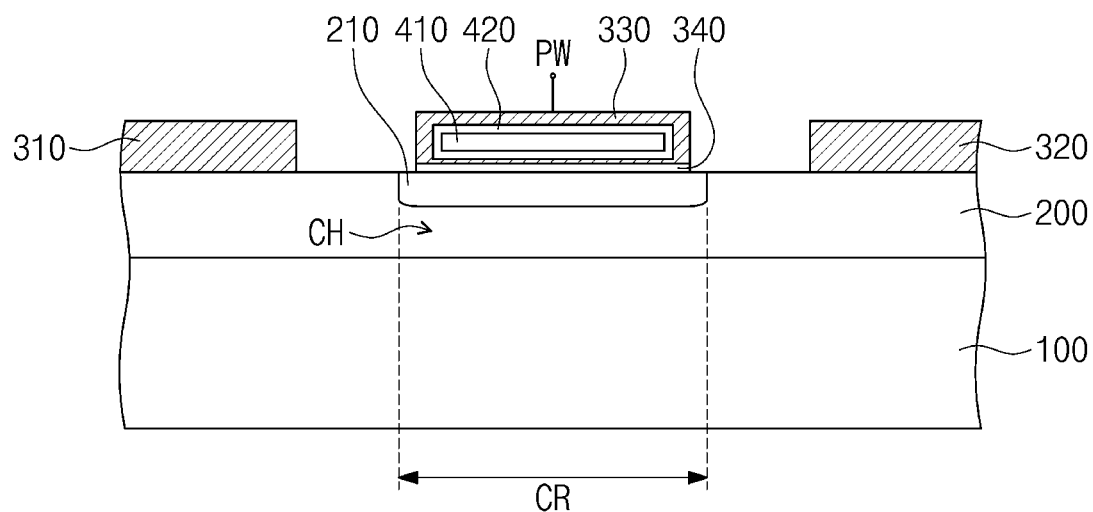
Figure 3:
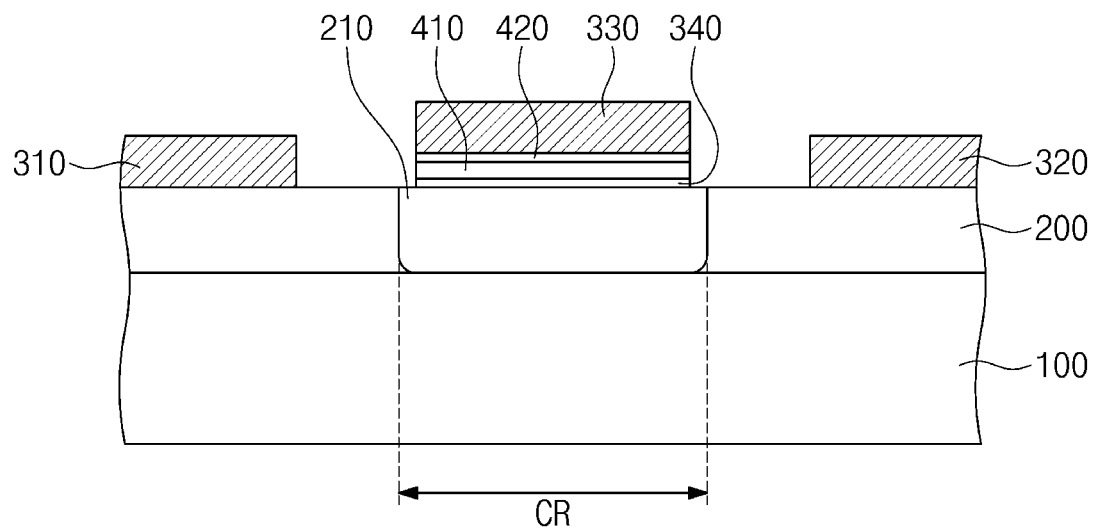
FIG. 3 is a cross-sectional view for explaining the field effect transistor according to the embodiments of the inventive concept.

Hereinafter, a field effect transistor according to an embodiment of the inventive concept will be described with reference to the accompanying drawings. FIGS. 1 and 2 are cross-sectional views for explaining the field effect transistor according to embodiments of the inventive concept. FIG. 3 is a cross-sectional view for explaining the field effect transistor according to the embodiments of the inventive concept.

Referring to FIGS. 1 to 2, a substrate 100 may be provided. The substrate 100 may include a semiconductor substrate or a sapphire ($Al_2O_3$) substrate. For example, the semiconductor substrate may include silicon (Si), a silicon carbide (SiC), a gallium arsenide (GaAs), a gallium nitride (GaN), a gallium phosphide (GaP), or an indium phosphide (InP). Also, the substrate 100 may be a high resistance substrate having an insulating property.

A semiconductor layer 200 may be disposed on the substrate 100. The semiconductor layer 200 may have a first conductive type. For example, the semiconductor layer 200 may have an n-type. The semiconductor layer 200 may have a high electrical conductivity. Specifically, the semiconductor layer 200 may include a large amount of carriers. For example, as a thickness of the semiconductor layer 200 increases, the amount of the carriers of the semiconductor layer 200 may increase, or a carrier concentration based on a unit volume of the semiconductor layer 200 may increase. The semiconductor layer 200 may include a semiconductor material doped with impurities. For example, the semiconductor substrate may include silicon (Si), a silicon carbide (SiC), a gallium arsenide (GaAs), a gallium nitride (GaN), a gallium phosphide (GaP), an indium phosphide (InP), germanium (Ge), a boron nitride (BN), a zinc oxide (ZnO), a tin oxide (SnO), or an indium oxide (InO). Alternatively, the semiconductor layer 200 may include a conductive material. For example, the conductive material may include a conductive metal oxide such as an indium tin oxide (ITO), an indium zinc oxide (IZO), or an aluminum-doped zinc oxide (AZO) or carbon (C). The semiconductor layer 200 may include a channel region CR that is defined as a region in which a channel through which a charge moves is provided or removed. For example, a channel extending between a source electrode 310 and a drain electrode 320, which will be described later, may be provided or removed in the channel region CR of the semiconductor layer 200 according to a voltage applied to a gate electrode 330, which will be described later. The semiconductor layer 200 may have a high carrier concentration. Thus, the semiconductor layer 200 may have a normally-on property that provides a channel in a state in which a voltage is not applied.

Although the substrate 100 and the semiconductor layer 200 are described as separate components, the embodiment of the inventive concept is not limited thereto. The substrate 100 and the semiconductor layer 200 may be provided by doping impurities on a substrate made of a semiconductor material or provided as a silicon-on-insulator (SOI) in which a silicon layer is provided on an insulation layer.

The source electrode 310 and the drain electrode 320 may be provided on a top surface of the semiconductor layer 200. Each of the source electrode 310 and the drain electrode 320 may include a conductor. Each of the source electrode 310 and the drain electrode 320 may ohmic-contact the semiconductor layer 200. For example, each of the source electrode 310 and the drain electrode 320 may include titanium (Ti), platinum (Pt), aluminum (Al), nickel (Ni), gold (Au) or a multi-layered metal film thereof. A charge may move in the channel region CR of the semiconductor layer 200 by a voltage difference between the source electrode 310 and the drain electrode 320.

A gate electrode 330 may be disposed on the top surface of the semiconductor layer 200. The gate electrode 330 may be disposed on the channel region of the semiconductor layer 200. In terms of a plane, the gate electrode 330 may be disposed between the source electrode 310 and the drain electrode 320. The gate electrode 330 may include a conductive material. For example, the gate electrode 330 may include metal such as aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), or zinc (Zn) or polysilicon. The gate electrode 330 may provide or remove a channel in the channel region CR of the semiconductor layer 200 by receiving a driving power from the outside.

A gate insulation layer 340 may be disposed between the gate electrode 330 and the semiconductor layer 200. The gate insulation layer 340 may electrically insulate the gate electrode 330 from the semiconductor layer 200. The gate insulation layer 340 may include a high dielectric material. The gate insulation layer 340 may have a dielectric constant greater than that of air. For example, the gate insulation layer 340 may have a dielectric constant of about 1.0 or more, preferably about 1.5 or more. For example, the gate insulation layer 340 may include a hafnium oxide ($HfO_2$) or a zirconium oxide ($ZrO_2$). However, the embodiment of the inventive concept is not limited thereto. For example, the gate insulation layer 340 may various high dielectric materials. Alternatively, the gate insulation layer 340 may include an insulating material such as an oxide or a nitride. For example, the gate insulation layer 340 may include a silicon oxide ($SiO_2$) or a silicon nitride (SiN).

A channel adjusting member 410 may be provided in the gate electrode 330. The channel adjusting member 410 may be disposed adjacent to the channel region CR of the semiconductor layer 200. Specifically, the channel adjusting member 410 may be buried below the gate electrode 330. The channel adjusting member 410 may emit a β-ray toward the channel region CR of the semiconductor layer 200. The β-ray may emit electrons. When the β-ray having a negative potential is emitted to the channel region CR in the n-type semiconductor layer 200 having positive carriers (e.g., a hole, etc.), a depletion layer 210 may be provided in the channel region CR as illustrated in FIG. 1. The depletion layer 210 may be provided in the channel region CR to block an electrical path between the source electrode 310 and the drain electrode 320 in the semiconductor layer 200. That is, the field effect transistor may maintain an off-state by the depletion layer 210. When a positive gate voltage PW is applied to the gate electrode 330, the depletion layer 210 provided in the channel region CR may be reduced as illustrated in FIG. 2. Specifically, the electrons injected from the β-ray to the channel region CR may move toward the gate electrode 330 by the positive gate voltage PW. That is, as a lower portion of the depletion layer 210 is partially removed, a channel CH may be provided in the channel region CR of the semiconductor layer 200, and an electrical path may be provided between the source electrode 310 and the drain electrode 320. The channel adjusting member 410 may include a material emitting the β-ray. For example, the channel adjusting member 410 may include a radioisotope capable of emitting the β-ray. The radioisotope may include a nickel isotope (Ni-63), tritium (H-3), a promethium isotope (Pm-147), or a strontium isotope (Sr-90).

According to embodiments of the inventive concept, a large amount of carriers is provided in the channel region CR. That is, when the field effect transistor is driven, a large amount of current may flow through the channel CH defined in the channel region CR, and thus an electrical property of the field effect transistor may improve.

When the semiconductor layer having a high carrier concentration is used as the channel, the field effect transistor may basically have a normally-on property. However, according to an embodiment of the inventive concept, the field effect transistor having a normally-off property may be realized as the depletion layer 210 is provided in the channel region CR by providing the channel adjusting member 410 varying a charge state of the channel region CR. In addition, since the channel CH is generated by a method of removing the depletion layer 210 provided in the channel region CR of the n-type semiconductor layer 200 in the field effect transistor according to an embodiment of the inventive concept, a driving power of the gate electrode 330 may be a positive voltage. Thus, a power circuit for applying a gate voltage PW to the gate electrode 330 may have a simple configuration.

According to other embodiments, the channel adjusting member 410 may be provided below the gate electrode 330.

As illustrated in FIG. 3, the channel adjusting member 410 may be disposed between the gate electrode 330 and the gate insulation layer 340 or the semiconductor layer 200. That is, the gate electrode 330 may be laminated on the channel adjusting member 410.

Referring to FIGS. 1 and 2 again, an adjusting member insulation layer 420 may be provided between the gate electrode 330 and the channel adjusting member 410. The adjusting member insulation layer 420 may surround the channel adjusting member 410. The adjusting member insulation layer 420 may electrically insulate the channel adjusting member 410 and the gate electrode 330 from each other. In case of an embodiment of FIG. 3, the adjusting member insulation layer 420 may be provided on only a top surface of the channel adjusting member 410. The adjusting member insulation layer 420 may electrically insulate the channel adjusting member 410 and the gate electrode 330 from each other. The adjusting member insulation layer 420 may include an insulating material. For example, the insulating material may include a silicon oxide ($SiO_2$) or a silicon nitride (SiN).

Figure 4:
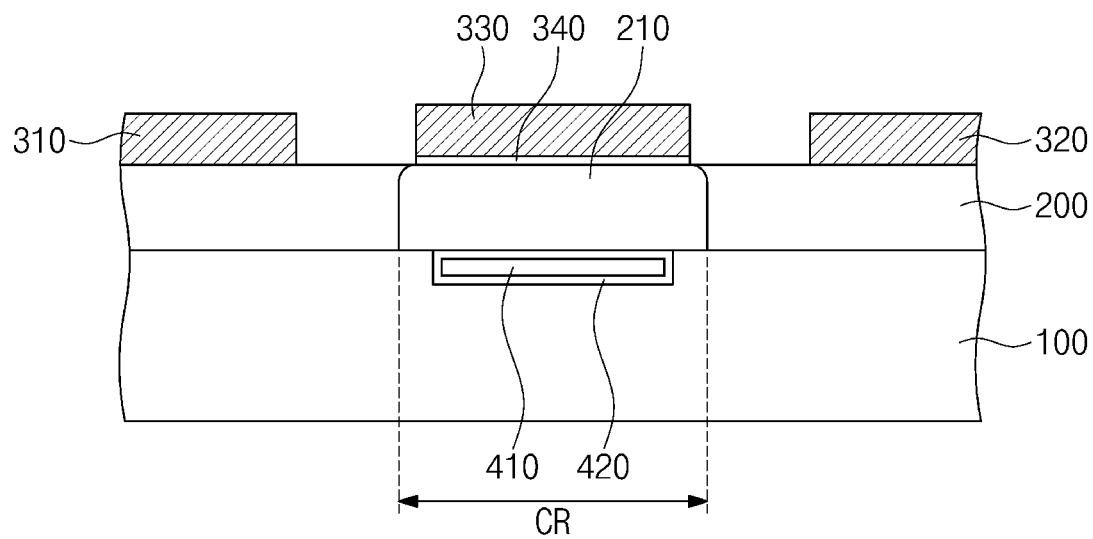
FIGS. 4 and 5 are cross-sectional views for explaining the field effect transistor according to the embodiments of the inventive concept.
Figure 5:
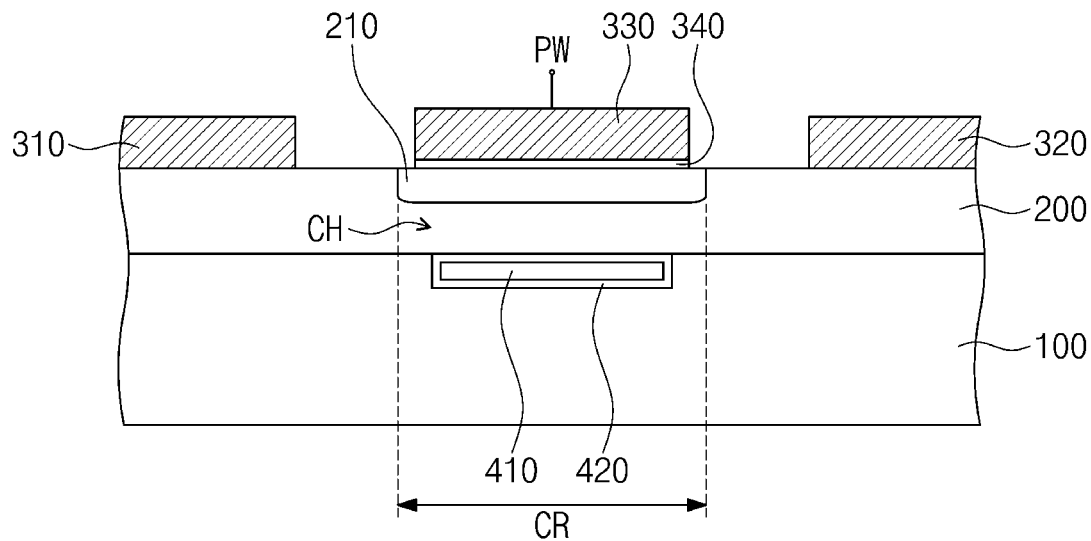
Figure 6:
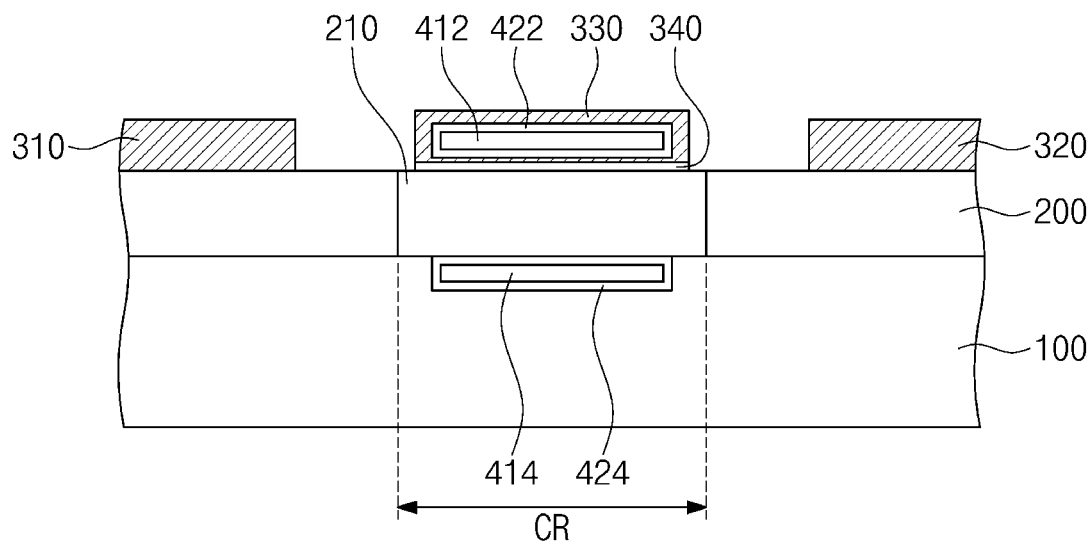
FIG. 6 is a cross-sectional view for explaining the field effect transistor according to the embodiments of the inventive concept.

FIGS. 4 and 5 are cross-sectional views for explaining the field effect transistor according to the embodiments of the inventive concept. FIG. 6 is a cross-sectional view for explaining the field effect transistor according to the embodiments of the inventive concept. Hereinafter, features that are previously described will be omitted.

Referring to FIGS. 4 to 5, a channel adjusting member 410 may be provided in the substrate 100. The channel adjusting member 410 may be disposed adjacent to the channel region CR of the semiconductor layer 200. Specifically, the channel adjusting member 410 may be buried on a bottom surface of the semiconductor layer 200, i.e., an upper portion of the substrate 100. An adjusting member insulation layer 420 may be provided between the substrate 100 and the channel adjusting member 410. The adjusting member insulation layer 420 may surround the channel adjusting member 410. The adjusting member insulation layer 420 may electrically insulate the channel adjusting member 410 and the substrate 100 from each other.

The channel adjusting member 410 may overlap the gate electrode 330 on a plane. The channel adjusting member 410 may emit a β-ray toward the channel region CR of the semiconductor layer 200. When the β-ray having a negative potential is emitted to the channel region CR in the n-type semiconductor layer 200 having positive carriers, a depletion layer 210 may be provided in the channel region CR as illustrated in FIG. 4. The field effect transistor may maintain an off-state by the depletion layer 210. When a positive voltage is applied to the gate electrode 330, the depletion layer 210 provided in the channel region CR may be reduced as illustrated in FIG. 5. Thus, a channel CH may be provided in the channel region CR of the semiconductor layer 200, and an electrical path may be provided between the source electrode 310 and the drain electrode 320. The channel adjusting member 410 may include a material emitting the β-ray.

According to other embodiments, the channel adjusting member may be provided in plurality. As illustrated in FIG. 6, a plurality of channel adjusting members 412 and 414 may be provided to all of the substrate 100 and the gate electrode 330. A first channel adjusting member 412 and a second channel adjusting member 414 may be provided above and below the channel region CR of the semiconductor layer 200, respectively. For example, the first channel adjusting member 412 may be buried below the gate electrode 330, and the second channel adjusting member 414 may be buried in an upper portion of the substrate 100. Each of the first channel adjusting member 412 and the second channel adjusting member 414 may emit a β-ray toward the channel region CR of the semiconductor layer 200, and a depletion layer 210 may be provided in the channel region CR by the β-ray emitted from the first channel adjusting member 412 and the second channel adjusting member 414. As the plurality of channel adjusting members 412 and 414 are provided, the depletion layer 210 may be further easily provided in the channel region CR of the semiconductor layer 200. In addition, the depletion layer 210 may be provided in the thick semiconductor layer 200, and when the thick semiconductor layer 200 is used, the field effect transistor having a large amount of current flowing through the channel CH provided in the channel region CR may be realized.

Figure 7:
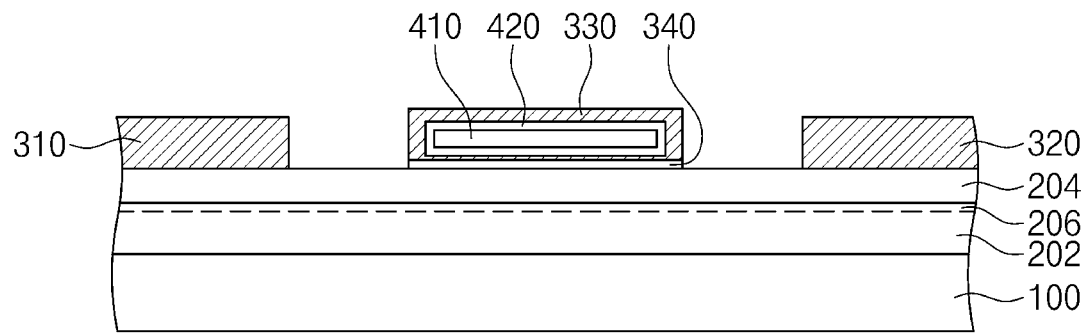
FIG. 7 is a cross-sectional view for explaining the field effect transistor according to the embodiments of the inventive concept.

FIG. 7 is a cross-sectional view for explaining the field effect transistor according to the embodiments of the inventive concept.

Referring to FIG. 7, a substrate 100 and first and second semiconductor layers 202 and 204 sequentially provided on the substrate 100 may be provided. The substrate 100 may have a top surface on which the first and second semiconductor layers 202 and 204 are provided and a bottom surface opposite to the top surface. The substrate 100 may be a high resistance substrate having an insulating property. For example, the substrate 100 may include sapphire ($Al_2O_3$), silicon (Si), a gallium arsenide (GaAs), a silicon carbide (SiC), or a gallium nitride (GaN). The substrate 100 may have a thickness of about 50 μm to about 400 μm through a substrate thinning process.

Each of the first semiconductor layer 202 and the second semiconductor layer 204 may include a semiconductor nitride. The first semiconductor layer 202 may include a gallium nitride (GaN), and the second semiconductor layer 204 may include a gallium aluminum nitride (AlGaN), an aluminum indium nitride (InAlN), or a gallium aluminum indium nitride (InAlGaN). Each of the first and second semiconductor layers 202 and 204 may be an epitaxial layer. Although not shown, a buffer layer may be provided between the substrate 100 and the first semiconductor layer 202, or a laminated structure of a buffer layer and a relaxation layer may be further provided therebetween. The buffer layer may include a gallium nitride (GaN), and the relaxation layer may include a gallium nitride (GaN) or an aluminum nitride (AlN). The buffer layer may be provided to resolve limitations caused by lattice mismatch between the substrate 100 and the first and second semiconductor layers 202 and 204, and the relaxation layer may be provide to relieve a stress between the first and second semiconductor layers 202 and 204. As the first semiconductor layer 202 and the second semiconductor layer 204 have a heterojunction structure (AlGaN/GaN, InAlN/GaN or InAlGaN/GaN), a 2-dimensional electron gas (2-DEG) layer 206 may be provided on an interface therebetween.

A source electrode 310 and a drain electrode 320 may be provided on the second semiconductor layer 204. Each of the source electrode 310 and the drain electrode 320 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). Preferably, the source electrode 310 and the drain electrode 320 may have a laminated structure of Ti/Au/Ni/Au. The source electrode 310 and the drain electrode 320 may ohmic-contact an upper portion of the second semiconductor layer 204 through a heat treatment process.

A gate electrode 330 may be disposed on the second semiconductor layer 204. In terms of a plane, the gate electrode 330 may be disposed between the source electrode 310 and the drain electrode 320. The gate electrode 330 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). Preferably, the gate electrode 330 may include palladium (Pd).

In this embodiment, the gate electrode 330, the source electrode 310, and the drain electrode 320, which are provided on the semiconductor layers 202 and 204 in which the 2-DEG layer 206 is provided, may provide a high-electron-mobility transistor (HEMT).

A gate insulation layer 340 may be disposed between the gate electrode 330 and the second semiconductor layer 204. The gate insulation layer 340 may electrically insulate the gate electrode 330 and the second semiconductor layer 204 from each other. The gate insulation layer 340 may include an oxide or a nitride.

A channel adjusting member 410 may be provided in the gate electrode 330. The channel adjusting member 410 may be buried below the gate electrode 330. The channel adjusting member 410 may emit a β-ray toward the 2-DEG layer 206 of the semiconductor layers 202 and 204. When the β-ray is emitted to the 2-DEG layer 206, a depletion layer may be provided in the 2-DEG layer 206 corresponding to a channel. The depletion layer may block an electrical path between the source electrode 310 and the drain electrode 320 in the 2-DEG layer 206. That is, the field effect transistor may maintain an off-state by the depletion layer. The channel adjusting member 410 may include a radioisotope capable of emitting the β-ray. The radioisotope may include a nickel isotope (Ni-63), tritium (H-3), a promethium isotope (Pm-147), or a strontium isotope (Sr-90).

A nitride semiconductor device using the 2-DEG layer 206 having the heterojunction structure of the first and second semiconductor layers 202 and 204 as a channel may basically have a normally-on property. However, in case of the embodiment of the inventive concept, as the channel adjusting member 410 varying a charge state of the 2-DEG layer 206 is provided, the depletion layer may be provided in the first and second semiconductor layers 202 and 204 to realize the field effect transistor having the normally-off property.

An adjusting member insulation layer 420 may be provided between the gate electrode 330 and the channel adjusting member 410. The adjusting member insulation layer 420 may surround the channel adjusting member 410. The adjusting member insulation layer 420 may electrically insulate the channel adjusting member 410 and the gate electrode 330 from each other. The adjusting member insulation layer 420 may include a silicon oxide ($SiO_2$) or a silicon nitride (SiN).

EXPERIMENTAL EXAMPLE

An experimental example is provided as shown in FIG. 1. Here, the semiconductor layer is provided by doping high concentration n-type impurities on a silicon (Si) substrate. Each of the source electrode, the drain electrode, and the gate electrode is provided by using multilayers of Ti/Au, and the gate insulation layer is provided by using a silicon oxide ($SiO_2$). The channel adjusting member in the gate electrode is provided by using a nickel isotope (Ni-63).

Comparative Example

A comparative example as may be similar to the experimental example. Here, the channel adjusting member is not provided in the gate electrode.

Figure 8:
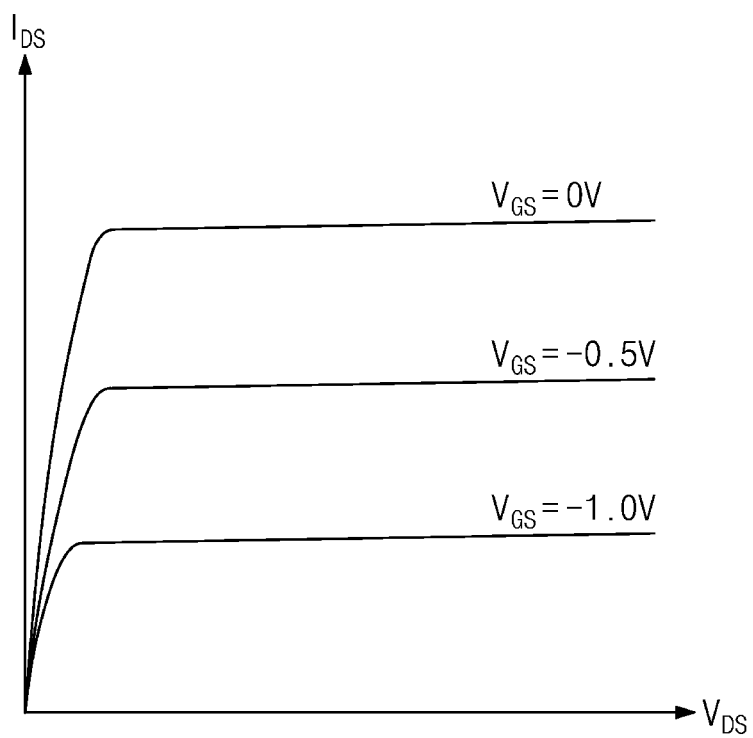
FIG. 8 is a graph representing a result obtained by measuring an electrical property of a comparative example.
Figure 9:
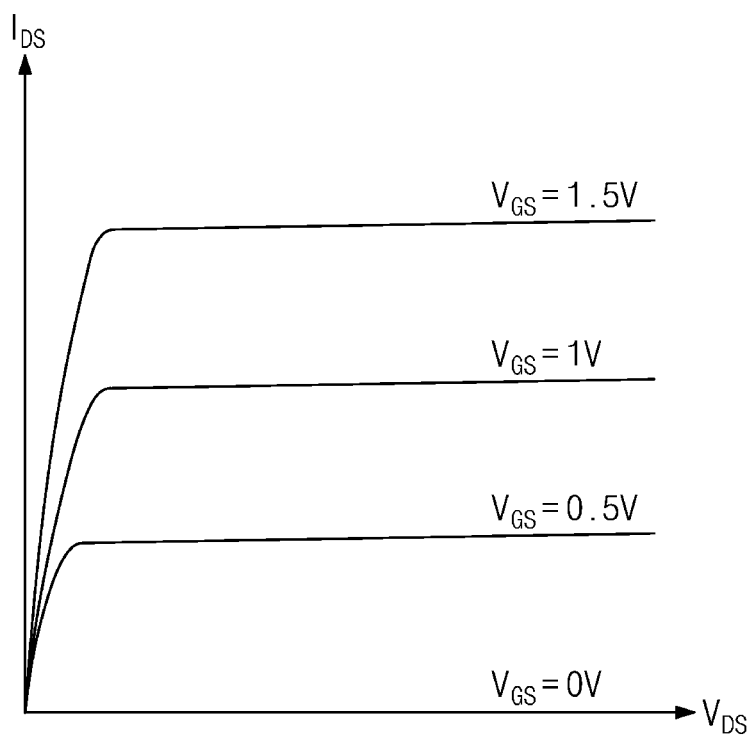
FIG. 9 is a graph representing a result obtained by measuring an electrical property of an experimental example.

FIG. 8 is a graph representing a result obtained by measuring an electrical property of the comparative example. FIG. 9 is a graph representing a result obtained by measuring an electrical property of the experimental example.

As illustrated in FIG. 8, when a gate voltage is not applied, it may be known that a current flows through a channel in the comparative example. That is, it may be known that the comparative example not including the channel adjusting member has the normally-on property and has to continuously apply a gate voltage in order to maintain the off-state of the field effect transistor.

In addition, it may be known that as the gate voltage gradually increases to a negative voltage, the current flowing through the channel decreases. That is, it may be known that the comparative example not including the channel adjusting member requires a negative gate voltage in order to turn-off the channel in the comparative example. In case of the field effect transistor driven by the negative gate voltage, a power circuit for applying a voltage to the gate electrode may have complicated configuration.

As illustrated in FIG. 9, when a gate voltage is not applied, it may be known that a current is not flown through a channel in the experimental example. That is, it may be known that the experimental example including the channel adjusting member has the normally-off property and is unnecessary to continuously apply a gate voltage in order to maintain the on-state of the field effect transistor.

In addition, it may be known that as the gate voltage gradually increases to a positive voltage, the current flowing through the channel increases. That is, the experimental example including the channel adjusting member requires a positive gate voltage in order to turn-on the channel in the experimental example. According to the embodiment of the inventive concept, the field effect transistor may be driven by the positive gate voltage, and the power circuit for applying a voltage to the gate electrode may have a simple configuration.

The field effect transistor according to the embodiments of the inventive concept may have the large amount of carriers in the channel region. That is, when the field effect transistor is driven, the large amount of current may flow through the channel defined in the channel region, and thus the electrical property of the field effect transistor may improve.

As the field effect transistor according to the embodiments of the inventive concept includes the channel adjusting member varying the charge state of the channel region, the depletion layer may be provided in the channel region, and thus the field effect transistor having the normally-off property may be realized.

In addition, in the field effect transistor according to the embodiments of the inventive concept, the driving power of the gate electrode may be the positive voltage. Thus, the power circuit for applying the gate voltage to the gate electrode may have the simple configuration.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the embodiments described above include exemplary in all respects and not restrictive, but it should be understood.

What is claimed is:

1. A field effect transistor comprising:
a semiconductor layer;
a gate electrode provided on a channel region in the semiconductor layer; and
a channel adjusting member provided adjacent to the channel region on one surface of the semiconductor layer and overlapping the gate electrode on a plane, wherein
the channel adjusting member provides a depletion layer in the channel region,
the depletion layer is provided by a β-ray, and
at least a portion of the depletion layer is removed when a positive voltage is applied to the gate electrode.

2. The field effect transistor of claim 1, wherein a channel is provided in the channel region when the positive voltage is applied to the gate electrode and the at least a portion of the depletion layer is removed.

3. The field effect transistor of claim 1, wherein the depletion layer is provided by the β-ray, which is emitted from the channel adjusting member.

4. The field effect transistor of claim 1, wherein the channel adjusting member is buried in the gate electrode and surrounded by the gate electrode.

5. The field effect transistor of claim 4, further comprising an adjusting member insulation layer disposed between the channel adjusting member and the gate electrode to electrically insulate the channel adjusting member and the gate electrode from each other.

6. The field effect transistor of claim 1, wherein the channel adjusting member overlaps the channel region in a substrate provided on a bottom surface of the semiconductor layer.

7. The field effect transistor of claim 1, wherein the channel adjusting member and the gate electrode are sequentially laminated on the channel region.

8. The field effect transistor of claim 1, wherein the channel adjusting member comprises a nickel isotope (Ni-63), tritium (H-3), a promethium isotope (Pm-147), or a strontium isotope (Sr-90).

9. The field effect transistor of claim 1, further comprising a source electrode and a drain electrode, which are provided on the semiconductor layer and spaced apart from each other with the gate electrode therebetween.

10. The field effect transistor of claim 1, wherein the semiconductor layer comprises a gallium nitride (GaN) layer and a gallium aluminum nitride (AlGaN) layer, which are sequentially laminated.

11. A field effect transistor comprising:
a semiconductor layer;
a source electrode and a drain electrode, which are spaced apart from each other on a top surface of the semiconductor layer;
a gate electrode disposed between the source electrode and the drain electrode on the top surface of the semiconductor layer;
a channel adjusting member buried in the gate electrode; and
a depletion layer provided in a channel region of the semiconductor layer, wherein
the channel adjusting member emits β-particles to the semiconductor layer, and
a portion of the depletion layer is removed by a positive voltage applied to the gate electrode.

12. The field effect transistor of claim 11, wherein the depletion layer is provided in the channel region of the semiconductor layer by the β-particles.

13. The field effect transistor of claim 12, wherein a channel is provided in the channel region of the semiconductor layer.

14. The field effect transistor of claim 11, further comprising an adjusting member insulation layer disposed between the channel adjusting member and the gate electrode to electrically insulate the channel adjusting member and the gate electrode from each other.

15. The field effect transistor of claim 11, wherein the channel adjusting member comprises a nickel isotope (Ni-63), tritium (H-3), a promethium isotope (Pm-147), or a strontium isotope (Sr-90).

16. The field effect transistor of claim 11, wherein the semiconductor layer comprises a gallium nitride (GaN) layer and a gallium aluminum nitride (AlGaN) layer, which are sequentially laminated.

* * * * *